(12) United States Patent
Negley

(10) Patent No.: US 6,967,116 B2
(45) Date of Patent: Nov. 22, 2005

(54) LIGHT EMITTING DEVICE INCORPORATING A LUMINESCENT MATERIAL

(75) Inventor: Gerald H. Negley, Hillsborough, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/853,921

(22) Filed: May 26, 2004

(65) Prior Publication Data
US 2004/0214358 A1 Oct. 28, 2004

Related U.S. Application Data

(62) Division of application No. 10/248,754, filed on Feb. 14, 2003.

(51) Int. Cl.$^7$ .............................................. H01L 21/00
(52) U.S. Cl. .............................. 438/22; 438/29; 438/46; 438/47
(58) Field of Search ......................... 438/22, 29, 46–47

(56) References Cited

U.S. PATENT DOCUMENTS

| | | | |
|---|---|---|---|
| 3,981,023 A | 9/1976 | King et al. | |
| 4,486,364 A | 12/1984 | Takahashi | |
| 4,501,637 A | 2/1985 | Mitchell et al. | |
| 4,841,344 A | 6/1989 | Heinen | |
| 4,918,497 A | 4/1990 | Edmond | |
| 5,068,771 A | 11/1991 | Savage, Jr. | |
| 5,078,919 A | 1/1992 | Ashley et al. | |
| 5,122,305 A | 6/1992 | Ashley et al. | |
| 5,137,659 A | 8/1992 | Ashley et al. | |
| 5,174,649 A | 12/1992 | Alston | |
| 5,240,647 A | 8/1993 | Ashley et al. | |
| 5,306,445 A | 4/1994 | Reed et al. | |
| 5,313,485 A | 5/1994 | Hamil et al. | |
| 5,631,190 A | 5/1997 | Negley | |
| 5,724,062 A | 3/1998 | Hunter | |
| 5,757,126 A | 5/1998 | Harvey, III et al. | |
| 5,912,477 A | 6/1999 | Negley | |
| 5,966,393 A | 10/1999 | Hide et al. | |
| 6,120,600 A | 9/2000 | Edmond et al. | |
| 6,201,262 B1 | 3/2001 | Edmond et al. | |
| 6,331,438 B1 * | 12/2001 | Aylott et al. | 436/172 |
| 6,373,007 B1 | 4/2002 | Calcatera et al. | |
| 6,380,105 B1 | 4/2002 | Smith et al. | |
| 6,391,515 B1 | 5/2002 | Su et al. | |
| 6,410,942 B1 | 6/2002 | Thibeault et al. | |
| 6,417,019 B1 | 7/2002 | Mueller et al. | |
| 6,436,613 B1 | 8/2002 | Fallahi et al. | |
| 6,488,414 B1 | 12/2002 | Dawes et al. | |
| 6,711,423 B2 * | 3/2004 | Colvin, Jr. | 600/317 |
| 2001/0000622 A1 | 5/2001 | Ulrike et al. | |
| 2001/0041025 A1 | 11/2001 | Farahi | |

FOREIGN PATENT DOCUMENTS

| | | |
|---|---|---|
| WO | WO 03/010832 A | 2/2003 |
| WO | WO 03/093393 A | 11/2003 |

OTHER PUBLICATIONS

Tadatsugu Minami et al.; *Electroluminescent Oxide Phosphor Thin Films Prepared by a Sol-gel Process*; Mat. Res. Soc. Symp. Proc.; pp. Q4.3.1–Q4.3.6; vol. 621; 2000 Materials Research Society.

D. Denzier et al.; *Luminescence studies of localized gap states in colloidal ZnS nanocrystals*; Journal of Applied Physics; Sep. 1, 1998; pp. 2841–2845; vol. 84, No. 5; 1998 American Institute of Physics.

*CIE Chromaticity Diagram*; www.siggraph.org/education/materials/HyperGraph/color/colorcie.htm; 2 pages.

*Waveguide Product Applications*; Waveguide Solutions™; www.waveguidesolutions.com/Products/Default.asp; 4 pages.

*Energy–Efficient Lighting for Kitchens and Bathrooms; Color Temperature and Color Rendering Index (CRI)*; www.energyoutlet.com/res/lighting/KandB/color.html; 2 pages.

Jennifer Quellette; *Materials Competition for Flat–Panel Displays*; The Industrial Physicist; pp. 10–13; Dec. 1997 American Institute of Physics.

* cited by examiner

Primary Examiner—Luan Thai
(74) Attorney, Agent, or Firm—Summa & Allan, P.A.

(57) ABSTRACT

A light emitting device uses a source of exciting radiation such as an light emitting diode to excite a photo luminescent material to provide a source of visible light. The photo luminescent material is loaded into a low density material such as a xerogel or an aerogel which is adjacent the source of exciting radiation.

20 Claims, No Drawings

LIGHT EMITTING DEVICE INCORPORATING A LUMINESCENT MATERIAL

This application is a divisional of copending application Ser. No. 10/248,754 filed Feb. 14, 2003.

BACKGROUND OF THE INVENTION

This invention relates to light emitting devices and in particular to light emitting diodes. More particularly, this invention concerns light emitting devices which use the emission from an electrically powered light emitting semiconductor device to stimulate photoluminescence in a material adjacent the semiconductor device.

Solid state photonic devices are a class of devices in which the quantum of light, the photon, plays a role. Photonic devices are often classified into three categories: light sources (light emitting diodes, lasers, diode lasers, etc.), photodetectors (photoconductors, photodiodes, etc.), and energy conversion devices (photovoltaic cells).

More specifically, light emitting diodes (LEDs) are semiconducting devices that emit light (including ultraviolet, visible, and infrared light) when a potential difference is applied across a p-n junction structure. There are a number of ways to make light emitting diodes and many associated structures, but these are generally well known, and the invention that will be described herein applies to most or all of them. Thus, they will not be discussed in detail hereinafter except as necessary to explain the invention. By way of example, and not of limitation, Chapters 12–14 of Sze, Physics of Semiconductor Devices, (2d Ed. 1981) and Chapter 7 of Sze, Modern Semiconductor Device Physics (1998) give a good explanation of a variety of photonic devices, including LEDs.

The term LED is used herein to refer to the basic semiconductor diode structure. The commonly recognized and commercially available "light emitting diode" that is sold (for example) in electronics stores typically represents a "packaged" device made up of numerous parts. These packaged devices typically include a semiconductor based LED such as (but not limited to) those described in U.S. Pat. Nos. 4,918,487; 5,631,190; and 5,912,477; various wire connections, and a package that encapsulates and protects the LED.

In many commercial embodiments, the package comprises a hard polymeric encapsulant material, which supplies a high degree of mechanical stability to the device. The package may also provide desirable optical characteristics such as color, shape (i.e., lensing) and refractive index. Various polymers have been used successfully over the years by different manufacturers as encapsulant material. Suitable polymers used in the past include cycloalaphatics, polymethyl methacrylate (PMMA), epoxies and polyurethanes.

Although the development of the LED has in many ways revolutionized the lighting industry, some of their characteristics have inhibited the commercialization of their full potential. For example, the emission spectrum of a LED typically exhibits a single, rather narrow peak at a wavelength (the peak wavelength) that is determined by the LED's composition and structure. This is, of course, advantageous in many circumstances, and the art is replete with patents directed to obtaining a precise combination of materials to achieve emission of a specific wavelength of electromagnetic radiation (e.g., blue light). For example, several known devices utilize indium gallium nitride (InGaN) as the active layer (i.e., light emitting layer) in the diode. In InGaN devices, different wavelengths of light are emitted by varying the mole fraction of In in the active layer. Other LEDs are based upon semiconductor materials having specific crystalline structures or active layers that are doped with specific elements in specific concentrations, all of which are done to achieve a specific wavelength of emitted radiation, which may or may not be in the visible spectrum.

Although specificity in light emission is beneficial in many LED applications (e.g., lasers), many otherwise commercially attractive applications of LEDs do not necessarily require the emission specificity inherent in LEDs. Accordingly, researchers are exploring methods to expand the realm of LED applications.

One area for LED expansion is the area of lighting, i.e. artificial (as opposed to daylight) illumination that provides a desired degree of intensity and reproduction of the true color of an object. Intensity refers to the amount of light produced over a given area and is measured in units such as lumens or candelas. Color reproduction is typically measured using the Color Rendering Index (CRI) which is a relative measure of the shift in surface color of an object when lit by a particular lamp. Daylight has the highest CRI (of 100), with incandescent bulbs being relatively close (about 95), and fluorescent lighting being less accurate (70–85). Certain types of specialized lighting have relatively low CRI's (e.g., mercury vapor or sodium, both at about 25).

Because LED's emit at specific wavelengths, they tend to fail (when standing alone) to provide illumination-quality CRI's, regardless of their intensity. Additionally, the nature of light and color are such that some colors (including "white" light) can only be reproduced by a combination of two or more "primary" colors, and thus cannot be reproduced by an individual, unpackaged semiconductor diode.

Nonetheless, because about one-third of the electricity generated in the United States each year goes to lighting, the efficiency of LED's provides a theoretically desirable option. Researchers have known for many years that incandescent light bulbs are very energy inefficient light sources: about ninety (90) percent of the electricity they use is released as heat rather than light. Fluorescent light bulbs are more efficient than incandescent bulbs (by a factor of about 4) but are still quite inefficient as compared to solid state LEDs. Furthermore, as compared to the normal lifetimes of semiconductor-based devices, incandescent bulbs have relative short lifetimes; i.e. about 750–1000 hours. In comparison, the lifetime of LEDs can often be measured in decades. Fluorescent bulbs have longer lifetimes (10–20,000 hours), but less favorable CRI's. Accordingly, researchers seek avenues to replace incandescent and fluorescent bulbs with more efficient LEDs.

One way in which the realm of LED applications has been expanded into areas previously dominated by incandescent and fluorescent bulbs is through the development and use of "white" LEDs. Because light that is perceived as white is in reality a blend of two or more colors, "white" photons do not exist and LED's, standing alone, do not produce white photons or white light. Thus, in general terms a white LED is either an LED pixel formed of respective red, green and blue LED's, or an LED that includes a luminescent material (phosphor) that emits white light (or a color that blends to form white light) in response to the particular wavelength emitted by the uncoated LED.

The luminescent materials are often mixed with the package material. Phosphors are common luminescent materials that are mixed with packaging materials. A phosphor is a luminescent material that emits a responsive radiation (e.g., visible light) when excited by a source of exciting radiation. In many instances the responsive radiation has a different—and for illumination purposes, more favorable—wavelength (frequency) than the exciting radiation. Phosphors are used, for example, in cathode ray tubes (of which a television tube is a typical example). A phosphor layer is applied to the wall of a cathode ray tube. An electron beam hits and excites the phosphor layer, causing the phosphor particles to emit light. Other examples of luminescent materials include fluorescent light bulbs, day glow tapes and inks which glow in the visible spectrum upon illumination with ultraviolet light.

In many instances phosphors emit light along a broader spectrum than the source of exciting radiation and at longer wavelengths. For example, some white LEDs are based upon LEDs having active layers that emit blue light. These blue-emitting LEDs include a phosphor, for example (but not limited to) a coating of a thin layer of a transparent material containing a phosphor. The phosphor-containing material can also be referred to as the, "conversion medium." When the blue light passes through the phosphor-containing material a portion of the blue light excites the phosphor which in turn emits yellow light (yellow light has a longer wavelength than blue light). This yellow light mixes with the remaining blue light from the active layer to create a bright white light. Subtle variations in the phosphor coating vary the tint of the white light from a bluish-white to a yellowish-white. Other phosphors may be combined with other LEDs to achieve different tones, colors or effects.

The blending of primary colors to produce combinations of non-primary colors is generally well understood in this and other arts. In general, the CIE Chromaticity Diagram (an international standard for primary colors established in 1931) provides a useful reference for defining colors as a weighted sum of three defined primary colors.

Currently, the inclusion of luminescent materials in LED based devices is accomplished by adding the materials to the plastic encapsulant material discussed above, for example by a blending or coating process. Accordingly, the packaging step is critical for consistency in the color characteristics and quality of the finished LED.

Using phosphors as an example, if the conversion medium is too thick or the phosphor content in the layer is too great "self-absorption" may occur. Self-absorption occurs when light emissions within the packaging layer stay within the packaging layer to excite other phosphor particles and eventually are absorbed back into the LED structure or are otherwise prevented from exiting the device, thus reducing performance (intensity) and efficiency. Additionally, the particle size of phosphors can become an issue by causing unwanted scattering of both the excitation source (the LED light) and the light generated by the phosphor.

The increased use of gallium nitride and other wide-bandgap semiconductors in LEDs that can emit photons in the ultraviolet (UV) portion of the electromagnetic spectrum, presents new obstacles to packaging because ultraviolet light tends to degrade many of the polymers typically used to package LED's. Furthermore, the higher power (GaN) devices currently entering the market require packaging techniques capable of withstanding the higher power output. For example, the radiation flux from some of the latest LEDs is a multiple or even an order of magnitude greater than that of natural sunlight.

Accordingly, there is a need for a packaging technique that reduces or eliminates the self-absorption and light scattering problems found in traditional luminescent technologies and enhances the light emissions from a LED. Similarly, there is a need for new packaging materials that reduce or eliminates the degradation issues inherent to polymer packaging materials.

In accordance with the background discussion, an object of the invention is to provide a light emitting device comprising a packaging material that offers improved resistance to degradation. A further object of the invention is to provide a light emitting device that reduces or eliminates the difficulties associated with known light emitting devices such as self-absorption and light scattering. Another object of the invention is to provide a method for forming a light emitting device that accomplishes the above objectives.

SUMMARY OF THE INVENTION

The above objects are met by the claimed invention which in one embodiment is a light emitting device comprising a light emitting diode that emits an exciting radiation such as light in the ultraviolet, infrared or visible electromagnetic spectrums. A porous matrix covers at least a portion of the light emitting diode (although not necessarily in direct contact with the diode). The porous matrix is in turn loaded with a material that emits a responsive radiation, particularly visible light, upon interaction with the radiation emitted by the diode.

In a further embodiment, the claimed invention is a method for forming a light emitting device. The method comprises loading a sol with a material which emits a responsive radiation upon interaction with exciting radiation. The ingredients in the sol are then allowed to undergo a sol-gel reaction to form a porous matrix such as a xerogel or aerogel. The method also encompasses placing porous matrix adjacent (but not necessarily in direct contact with) a light emitting diode which provides a source of exciting radiation.

DETAILED DESCRIPTION OF THE INVENTION

The Light Emitting Diode

The light emitting device according to the invention comprises a light emitting diode, at least a portion of which is covered by a porous matrix that is loaded with a quantity of a substance which emits a responsive radiation when excited by the exciting radiation emitted by the diode. The term "covered" is used in a broad sense, and it will be understood that the porous matrix need not be in direct contact with the LED or its emitting layers. Other intervening layers can be included, including layers that, by virtue of factors such as structure or refractive index, increase the light extracted from the diode before that light enters the conversion layer or medium.

The light emitting diode may be any commercially available light emitting diode. In preferred embodiments, however, the light emitting diode is a diode having a Group III nitride active layer and a silicon carbide substrate. Suitable Group III nitride active layers include those comprising gallium nitride (GaN), indium gallium nitride (InGaN), aluminum gallium nitride (AlGaN) and indium aluminum gallium nitride (InAlGaN) among others. Light emitting diodes from Cree, Inc., of Durham, N.C., and particularly blue light emitting diodes from Cree, Inc., are preferred in the practice of the invention. The active layers or portions can include homojunctions, single heterojunctions, double heterojunctions, quantum wells, multiple quantum wells, and superlattice structures. Exemplary devices are set forth in commonly assigned U.S. Pat. Nos. 4,918,497; 5,724,062; 5,912,477; 6,120,600; 6,201,262; and 6,373,007 and are sold under the trademarks ULTRABRIGHT™ and MEGABRIGHT™. In preferred embodiments such diodes have a radiant flux of at least 1.7 milliwatts (mW).

Because the invention relates primarily to light extraction, the substrate can include other suitable materials such as sapphire or potentially bulk gallium nitride as this material becomes more widely available.

As used herein the term "exciting radiation" refers to any type of electromagnetic radiation capable of being emitted from the light emitting diode. Such radiation includes visible light, ultraviolet light, and infrared light. Those skilled in the art know that the terms visible light, ultraviolet light, and infrared light refer to portions of the electromagnetic spectrum whose general boundaries are well understood in this and other arts. Accordingly, Applicant's use of these terms to describe the exciting radiation is well known and accepted by those skilled in the art, clearly defines the term exciting radiation, and allows one skilled in the art to practice the invention without undue experimentation.

Sol-Gel Technology

The present invention utilizes the technology of nanoporous materials to improve the performance of light emitting devices. In a broad aspect, the invention utilizes a dried nanoporous gel loaded with a luminescent material as packaging for a diode. The diode emits an exciting radiation that interacts with the luminescent material which in turn emits a responsive radiation (e.g., visible light). In preferred embodiments, the dried nanoporous gel is a highly porous matrix such as an aerogel or a xerogel.

The nanoporous materials utilized in the present invention may be generally described as sol gel materials. In one sense, the term sol gel does not describe a product per se, but more precisely a reaction mechanism whereby a sol, which is a colloidal suspension of solid particles in a liquid, transforms into a gel (which is still a colloid, but in a more solid form than a sol) following growth and interconnection of the solid particles.

As used herein (an elsewhere), however, the term sol gel describes a porous matrix formed by a sol gel reaction mechanism and from which the liquid has been removed leaving behind a low-density, high porosity solid structure.

Although the exact mechanism by which a sol gel reaction occurs is not precisely known, one theory advanced by sol gel researchers is that through continuous reactions within the sol, one or more molecules in the sol eventually reach macroscopic dimensions and form a solid network which extends substantially throughout the sol. At this point (called the gel point), the substance is said to be a gel. If this definition is used, a gel is a substance that contains a continuous solid skeleton enclosing a continuous liquid phase. A more detailed discussion of similar and alternative theories for gel formation is set forth in Chapter 2 of J. Wright & N. Sommerdijk, Sol-Gel Materials: Chemistry and Applications (2001) and Chapter 5 of J. Brinker & G. Scherer, Sol-Gel Science (1990).

The production of sol gel materials is well known by those skilled in the art and, as noted above, well represented in the literature. As an aid to the reader, however, the following brief discussion is offered. It should be understood that the following is only a general discussion and that particular methods for forming the sol-gel materials can vary depending upon the circumstances. Additional information regarding variations in sol gel processing is set forth in the texts cited above.

Broadly speaking, sol gel materials are produced by the polymerization of components containing inorganic metal ions and oxygen ions such as metal oxides, alkoxides, and alcholates. Metal sulfides may also be suitable. Polymerization results in the formation of a gel containing the polymerized material and a liquid as two continuous phases. The liquid dispersion medium is removed by slow drying or supercritical drying and can result in little or no shrinkage of the underlying structure of the polymerized material. The resulting product is a dry porous matrix having high porosity, low density, and high surface area.

If the porous matrix has a very high porosity (e.g., above about 90% by volume) the material is usually referred to as an aerogel. Materials with a porosity of 70% or less are sometimes called xerogels. Materials with porosities between 70% and 90% are usually considered aerogels although this characterization depends upon the particular reference cited. The distinctions between and among gels, aerogels and xerogels and the particular porosity classifications are somewhat arbitrary, but the several uses of these terms herein will easily be understood, particularly in context, by those skilled in the art.

As noted previously, the methods for making a porous matrix (e.g., a xerogel or an aerogel) are generally well known in the art. The process begins with a suspension of inorganic particles which react to form a network which extends substantially throughout the sol.

The materials used in the formation of sol gel materials may include oxides of such elements as silicon, aluminum, boron, titanium, zirconium, vanadium, yttrium, magnesium, molybdenum, iron, etc. Examples of suitable starting materials include $SiO_2$, $Si(OCH_3)_4$, $Si(OC_2H_5)_4$, AlOOH, $Al(OC_4H_9)_3$, $B(OC_4H_9)_3$, $Ti(OC_3H_7)_4$, $Zr(OC_3H_7)_4$, $TiO_2$, $ZrO_2$, etc., and mixtures thereof.

As sol gel technology advances, other starting materials are beginning to emerge in the industry. For example, U.S. Patent Application Publication 20010041025, which is incorporated entirely herein by reference, discusses a sol gel method using a prehydrolyzed silica based sol gel containing methacryloxypropyltrimethoxysilane (MAPTMS) and a photoinhibitor. The material and methods for forming sol gels that are discussed in the 20010041025 publication are particularly applicable to the present invention and are discussed in greater detail below.

In preferred embodiments of the invention the sol gel material comprises a silica compound. Two of the most common starting materials for forming xerogels and aerogels are $Si(OCH_3)_4$ (tetramethylorthosilicate or TMOS) and $Si(OC_2H_5)_4$ (tetraethylorthosilicate or TEOS). TEOS is often preferred because it is less toxic than TMOS. The aerogel manufacturing methods associated with TMOS and TEOS are well known in the art and are set forth in the cited texts and will not be specifically discussed herein. However, an exemplary TEOS process is discussed below as an aid to the reader.

A stock sol gel solution is prepared. The stock solution usually comprises TEOS and a solvent in a specified ratio. TEOS is not soluble in water therefore TEOS processes typically use a binary solvent system of water and an alcohol. Other specifics regarding the creation of stock solutions of non-TEOS based gels are located in Chapter 3 of J. Brinker & G. Scherer, Sol-Gel Science (1990). If additives (e.g., phosphors) are required they are usually mixed into the stock solution.

One method of forming a sol gel porous matrix is through hydrolysis and condensation reactions, which can cause a multifunctional monomer in a solution to polymerize into relatively large, highly branched particles. For example, TEOS monomer may be partially hydrolyzed in water by the reactio

Reaction conditions may be controlled such that, on the average, each monomer undergoes a desired number of hydrolysis reactions to partially or fully hydrolyze the monomer. TEOS which has been fully hydrolyzed becomes $Si(OH)_4$. Once a molecule has been at least partially hydrolyzed, two molecules can then link together in a condensation reaction, such as

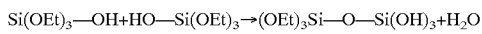

or

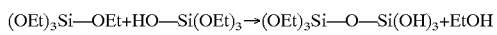

to form an oligomer and liberate a molecule of water or ethanol.

The Si—O—Si configuration in the oligomer formed by these reactions has three sites available at each end for further hydrolysis and condensation. Thus, additional monomers or oligomers can be added to this molecule in a somewhat random fashion to create a highly branched polymeric molecule from literally thousands of monomers.

At some point the growing network of molecules forms continuous solid skeleton enclosing a continuous liquid phase. When this occurs the sol is considered to have transformed into a gel.

After the gel is formed several additional steps must occur to create a porous matrix suitable for use in the invention. For example, the gel must be aged. Ageing encompasses continued cross-linking of oligomers and strengthening of the polymeric network. Depending upon the solvents and materials utilized in forming the gel, ageing can take anywhere from seconds to minutes to hours to days.

After ageing is complete the gel is dried. As with the other steps, there are many variables that may be adjusted in the drying step depending upon the desired characteristics of the final gel. For example, the gel may be dried under atmospheric conditions or under supercritical conditions. Drying by evaporation under normal conditions gives rise to capillary pressure that causes shrinkage of the gel network to form a xerogel. Such drying often reduces the gel's volume by a factor of 5 to 10 compared to the original wet gel.

If the wet gel is placed in an autoclave and dried under supercritical conditions, there is no interface between liquid and vapor, so there is no capillary pressure and relatively little shrinkage. This process is called supercritical drying and generally results in an aerogel. Aerogels may be mostly air, having fractions of solid as low as about 1%.

Similarly, the gel may undergo solvent exchange prior to drying. An example of such a solvent exchange is when the primary gel solvent (e.g., ethanol) is replaced with liquid CO2 in a pressurized chamber. Solvent exchange reduces capillary pressures on the gel thereby preventing substantial collapse of the gel during drying. A very detailed discussion of gel drying is located in Chapter 8 of J. Brinker & G. Scherer, Sol-Gel Science (1990).

A more recent method for forming thin film dried inorganic gels is discussed in U.S. Pat. No. 6,380,105. This method appears to improve upon the traditional methods discussed above, particularly when higher porosity aerogels are desired. This method avoids the traditional ethanol based solvent system in favor of a less volatile solvent system. In preferred embodiments the solvent system is a glycerol system. The use of glycerol allegedly allows the gel to be dried in the absence of supercritical conditions while retaining the high degrees of porosity required for an aerogel. Other alleged benefits attributed to the glycerol method include greater control of porosity by adjusting the TEOS/solvent ratios, shorter gel times, simplified ageing, and high optical clarity.

Following drying, the dried gel may undergo additional treatment as necessary to achieve desired end results. As noted previously there are numerous variations on making xerogels and aerogels. For example, columns 13 and 14 of U.S. Pat. No. 5,078,919 discuss such variations (e.g., varying the phosphor content in the gel) and cite references for more detailed information about such variations. Finally, those skilled in the art understand that, to a certain degree, the steps involved in the formation of a porous matrix such as a xerogel or an aerogel occur simultaneously. Accordingly, the above discussion should not be considered as a recitation of a formal stepwise method but rather as a series of steps which may overlap one another.

The process discussed above can be used to make bulk gels or thin gels. Again, those skilled in the art know the modifications needed to make either a bulk or a thin gel. If a bulk gel is formed for use in the invention it will need to be shaped and physically attached to the diode in some manner (e.g., using an epoxy). Methods of doing both are known to those skilled in the art. Although physical attachment of a bulk gel to a diode is possible, a more preferred method of forming the light emitting device of the invention comprises forming the dried inorganic gel on the diode. As noted previously, the phrase "on the diode" can include forming the gel on some additional intervening structure or layer that is part of the overall diode structure.

The gel solution may be applied to a diode by several methods. Spray coating, spin coating, and dip coating are all well known methods for applying a thin film or coating to a substrate and all three may be utilized in the practice of the invention. Spin coating is the preferred method for depositing thin film when the MAPTMS method of Publication 20010041025 is used. The 20010041025 publication also presents several examples of how to accomplish such spin coating. Those skilled in the art will readily recognize which method of application is best suited for the desired results.

For example, in the spin coating process the film is typically deposited and dried in a few seconds, whereas in the case of dip coatings the film is typically applied at a rate of a few centimeters per minute. Consequently dip coating generally leads to better alignment of the polymer molecules, resulting in a denser, less rough film than does spin coating. Both methods, however, have in common that there is generally an inverse relation between the thickness of the film and its density, e.g., thin films are usually denser than thick films. Wright and Sommerdijk also state that spin coating can provide highly uniform coatings but it is not generally suitable for depositing very thick films and is not convenient for the coating of large areas of unsymmetrical substrates. On the other hand, dip coating is a technique that is well suited for such tasks, although care must be taken to maintain uniformity of the coating near the edges of the substrate.

Furthermore, it is evident that the composition of the applied sol is important in determining the characteristics of the coating. Chapter 6 of J. Wright & N. Sommerdijk, Sol-Gel Materials: Chemistry and Applications (2001) provides the following general principles that should be considered when forming a porous sol gel matrix.

Alkoxides of lower alkyls produce denser films with higher oxygen content.

Pore size and surface area strongly depend upon the solvent.

Hydrolytic condensation in dilute solution leads to smaller particles and hence to a finer texture and a higher porosity.

Higher water contents during hydrolysis lead to denser films.

Aggregation of particles prior to deposition leads to highly porous films.

The pore size distribution of the sol gel porous matrix is generally in the range of from about 1 nm to about 500 nm, preferably about 1 nm to about 200 nm, and especially about 1 nm to about 100 nm. The surface area of the porous matrix is generally at least about 100 $m^2/g$, preferably at least about 500 $m^2/g$, particularly greater than about 1000 $m^2/g$, and especially greater than about 1200 $m^2/g$.

The density of the porous matrix may vary. Low density material, however, is preferred to minimize unwanted absorption of exciting radiation by the matrix. The density at the porous matrix should be between about 0.01 $g/cm^3$ and 1.6 $g/cm^3$.

The optical characteristics of xerogels and aerogels are also relevant to the practice of the invention. The porous matrix utilized in the practice of the invention should be transparent to a source of exciting radiation such as the electromagnetic radiation emitted from the active layer of a diode. In preferred embodiments the porous matrix is an aerogel and is substantially or entirely transparent with respect to ultraviolet light and/or infrared light and/or visible light. The transparency of the porous matrix to the exciting radiation need not be 100% but should be sufficient to satisfy the light generation purposes for which it was intended. Likewise, the porous matrix should be transparent to at least a portion of the light generated by the luminescent material and preferably all of the light generated by the luminescent material.

Thin films and coatings of sol gel materials have long been used to alter the optical properties (e.g., reflection, transmission, refraction and absorption) of a substrate. Architectural glass coated with a thin film of titanium dioxide/lead ($TiO_2$/Pb) is a well known example of such use. $TiO_2$ controls the reflectivity and the lead content provides the desired absorption.

Those skilled in the art recognize that just as with porosity, sol gel materials may possess a wide range of optical properties depending on the method of manufacture. For example, the optical properties (e.g., refractive index) of a sol gel may be adjusted for a particular application by adjusting the gel's porosity, thickness, and stoichiometry, etc. Likewise, variables such as porosity, density, and thickness are controlled or are influenced by other variables such as the method of drying, the method of application (e.g., spin coating vs. dip coating) and reaction conditions.

In one aspect, the invention comprises the MAPTMS/photoinhibitor method of making a sol gel covering. In this aspect the sol gel material is spun on the light emitting diode to create a discrete layer having specific physical characteristics (e.g., porosity) including optical properties. Alternatively, the sol gel material may be spun on in several discrete layers having different porosities, thickness, densities, etc. The layer or layers may be shaped using photolithographic techniques. In this manner, a lens may be formed from a single layer of sol gel material. Similarly, several layers of material having different refractive indexes can be combined to produce a lens having desired optical properties. For example, this technique could be used to create a Fresnel lens on a light emitting diode to significantly enhance the performance of the resulting diode package.

In short, there are numerous combinations of variables that can be manipulated by those skilled in the art to achieve a desired set of optical properties and the invention should be interpreted to encompass such variations. A more detailed discussion of the optical properties of sol-gel materials is located in Chapter 14 of J. Brinker & G. Scherer, Sol-Gel Science (1990).

The dried gel according to the invention is loaded with a quantity of a substance that emits responsive radiation upon interaction with an exciting radiation. The term "loaded" as used herein is intended to be used in the broadest sense of the word. Thus, loaded means any form of association or contact, direct or indirect, which results in a composite composition, the components of which are capable of performing their intended functions such as emitting a responsive radiation upon interaction with an exciting radiation. Loaded thus includes, for example, any type of incorporation, such as encapsulation, embedding, entrapment, or the like, as well as any form of bonding such as absorption, adsorption, chemisorption, covalent bonding, etc.

In one embodiment, the substance that emits a responsive radiation upon interaction with an exciting radiation is a luminescent material capable of being loaded into the dried gel. Photoluminescent materials are particularly preferred. Suitable luminescent materials include but are not limited to luminescent glasses, phosphors, and mixtures thereof.

As well-known and well-understood by those of ordinary skill in this art, phosphors consist essentially of highly purified inorganic materials doped with small quantities of suitable additives that are referred to as, "dopants" or "activators." Activators are usually present in concentration levels varying from a few parts per million up to one or two percent of the host lattice. Some phosphors can incorporate more than one activator, with the term "co-activators" being used to describe them.

The color of light emitted by many well-known luminescent compounds such as zinc sulfide depends mainly on the activators. This leads to experimentation and development of different families of phosphors with color schemes specifically developed for particular applications (e.g., color television).

Display phosphors are usually unique to particular applications, because their characteristics must be tailored to the type of stimulus and the wavelength of the output radiation required.

Exemplary phosphors include oxide-based phosphors (e.g., $Ga_2O_3$:Mn and similar compounds) zinc sulfide (ZnS), copper-activated ZnS, copper and aluminum-activated ZnS, magnesium-doped ZnS, cadmium sulfide, and yttrium aluminum garnet ("YAG"). YAG is useful because it can form a yellow-emitting phosphor that complements a blue-emitting LED to produce white light. ZnS phosphor particles entrapped within a low density, nanoporous aerogel matrix is an example of a loaded porous matrix in accordance with the invention. When excited by photons in the UV range of the electromagnetic spectrum, these phosphors emits a spectrum of radiation depending upon the purity of the sample, the crystalline structure of the material, and the particular doping. Many other luminescent compounds are known in the art and are encompassed by the invention. For example, luminescent glasses such as lithium rich silicate glass doped with cerium can be ground into a powder and dispersed in a dried inorganic gel such as an aerogel.

The luminescent particles are preferably dispersed throughout the porous matrix. For example, soluble or insoluble phosphor particles can be added to a sol dispersion which is subsequently gelled and dried to form a porous matrix. When water is the dispersion medium, water soluble phosphors such as thallium activated cesium iodide or thallium activated potassium iodide can be used advantageously. In such cases the use of water soluble phosphors can enhance transparency of the resultant doped aerogel.

The particle size of the luminescent material can vary within a wide range, e.g., 0.001 to 20 microns. Light scattering can increase in direct proportion to particle size so that particles on the order of 1 to 2 microns or smaller are preferred. The use of smaller particles, e.g., 0.01 to 0.4 microns, can enhance the transparency of the porous matrix and thereby increase the optical depth and light intensity of the light emitting device.

Generally the phosphors are loaded in the porous matrix at a concentration sufficient to produce the desired emission at the desired level of exciting radiation (i.e., the radiant flux of the LED) while avoiding overloading the porous matrix to the point of structural disadvantage. The actual loadings will also vary depending upon the type of phosphor used. For example, if solid ZnS is the phosphor of choice, a typical loading would be in the range of about 0.05 grams to about 10 grams of phosphor powder per 10 milliliters of stock sol solution (which results in a phosphor loading ranging from about 0.005 to about 1.0 gram per cc of stock solution). In most circumstances, the phosphor is loaded into the sol by mixing the phosphor into the stock solution.

The invention can also be incorporated with laser diodes. As known to those familiar with this art, a laser diode shares some of its fundamental operating principles with an LED; i.e., photons are emitted based on events generated by the recombination of electrons and holes. Laser diodes, however, are designed and constructed to emit light in one specific direction, to be monochromatic (because of the lasing effect) and to produce coherent radiation. An appropriate discussion of semiconductor lasers is set forth in the two Sze references referred to earlier, specifically at Sections 12.4 and 12.5 of Physics of Semiconductor Devices and at Sections 7.2, 7.3 and 7.4 of Modem Semiconductor Physics.

As noted in the background section, one purpose of the invention is to expand the realm of LEDs in lighting applications. Accordingly, the invention also encompasses numerous devices that incorporate the invention's light emitting device. For example, one area in which white LEDs are already making a degree of progress is the area of camping and hiking equipment. White LEDs are now seen in flashlights and camping lanterns. Household lamps using white LEDs are now found in the marketplace. Other types of LEDs are found in traffic signals and other outdoor lighting applications. LEDs are also used in forming pixels for use in flat panel displays such as those described in commonly assigned U.S. Pat. No. 5,724,062 to Hunter. It is envisioned that the light emitting device of the current invention can be and will be utilized in any current and future LED application.

In the drawings and specification there has been set forth a preferred embodiment of the invention, and although specific terms have been employed, they are used in a generic and descriptive sense only and not for purposes of limitation, the scope of the invention being defined in the claims

What is claimed is:

1. A method for forming a light emitting device, the method comprising:

loading a sol with a substance which emits a responsive radiation upon interaction with exciting radiation;

forming a porous matrix from the loaded sol; and placing the porous matrix adjacent a light emitting diode which provides a source of exciting radiation.

2. A method according to claim 1 comprising placing the porous matrix directly on the diode.

3. A method according to claim 1 comprising loading the substance in the sol at a concentration sufficient to produce a desired emission of visible light at a desired level of exciting radiation while avoiding overloading resulting the porous matrix to the point of structural disadvantage.

4. A method according to claim 1 wherein the sol comprises particles of silica.

5. A method according to claim 1 wherein comprising loading the sol with methacryloxypropyltrimethoxysilane.

6. A method according to claim 1 wherein the step of forming the porous matrix comprises forming a xerogel.

7. A method according to claim 1 wherein the step of forming the porous matrix comprises forming an aerogel.

8. A method according to claim 1 wherein the step of loading the sol comprises loading a sol that includes an alcohol as a solvent.

9. A method according to claim 8 wherein the alcohol is selected from the group consisting of ethanol and glycerol.

10. A method according to claim 1 wherein the step of placing the porous matrix adjacent a light emitting device is selected from the group consisting of molding and casting the sol on the light emitting diode.

11. A method according to claim 1 comprising spin coating the sol on the light emitting diode.

12. A method according to claim 1 comprising spray coating the sol on the light emitting diode.

13. A method according to claim 1 comprising dip coating the sol on the light emitting diode.

14. A method according to claim 1 wherein the step of forming the porous matrix comprises drying the sol under supercritical conditions.

15. A method according to claim 1 wherein the step of forming the porous matrix comprises drying the sol gel material under non-supercritical conditions.

16. A method according to claim 1 comprising loading the sol with a phosphor.

17. A method according to claim 16 comprising loading the sol with a phosphor is in the form of particles between about 0.001 microns and about 20 microns.

18. A method according to claim 16 comprising loading the sol with a phosphor is selected from the group consisting of oxides of silicon, aluminum, boron, titanium, zirconium, vanadium, yttrium, magnesium, molybdenum, and iron; and $SiO_2$, $Si(OCH_3)_4$, $Si(OC_2H_5)_4$, $AlOOH$, $Al(OC_4H_9)_3$, $B(OC_4H_9)_3$, $Ti(OC_3H_7)_4$, $Zr(OC_3H_7)_4$, $TiO_2$, and $ZrO_2$, YAG, garnet-based phosphors and mixtures of two or more of these.

19. A method according to claim 1 comprising loading the sol by loading the luminescent material in a stock solution in an amount of between about 0.005 and 1.0 gram per cc of stock solution, and then forming the sol from the loaded stock solution.

20. A method according to claim 1 wherein the step of placing the porous matrix adjacent the light emitting diode comprises forming the porous matrix separate from the diode then mechanically placing the porous matrix adjacent the light emitting diode.

* * * * *